United States Patent

[11] 3,571,750

[72] Inventors Herbert N. Carlson
Berkeley Heights;
James W. Gewartowski, Chatham, N.J.

[21] Appl. No. 811,950
[22] Filed Apr. 1, 1969
[45] Patented Mar. 23, 1971
[73] Assignee Bell Telephone Laboratories, Incorporated
Murray Hill, N.J.

[54] NEGATIVE RESISTANCE AVALANCHE DIODE OSCILLATOR CIRCUITS
22 Claims, 6 Drawing Figs.

[52] U.S. Cl. .................... 331/107, 331/56, 331/96, 332/16
[51] Int. Cl. .................... H03b 7/14
[50] Field of Search .................... 331/107, 56; 332/9, 66

*Primary Examiner*—John Kominski
*Attorneys*—R. J. Guenther and Arthur J. Torigliere ABSTRACT: An oscillator circuit comprises a cavity resonator and two avalanche diodes having interconnected anode contacts. The diodes extend across the resonator and a tuning plunger extends toward the diode interconnection. With appropriate diode and circuit parameters, the resonator supports oscillatory modes at frequencies *f* and 2*f*. Energy is derived at frequency *f*, which is below the inherent resonant frequency of the individual diode packages.

INVENTORS H.N. CARLSON
J. W. GEWARTOWSKI
BY
Roderick B. Anderson
ATTORNEY

NEGATIVE RESISTANCE AVALANCHE DIODE OSCILLATOR CIRCUITS

BACKGROUND OF THE INVENTION

This invention relates to negative resistance avalanche diode oscillator circuits, and more particularly, to oscillator circuits that include IMPATT avalanche diodes. "IMPATT" is an acronym for impact ionization avalanche and transit time, a phenomenon described, for example, in the patent of B. C. De Loach, 3,270,293.

IMPATT diodes are avalanche diodes which, because of their negative resistance when used in an appropriate circuit, are useful as microwave sources. The diode is typically enclosed in a package mounted in a microwave resonator having a resonant frequency $f$ approximately equal to the transit-time frequency of pulses within the diode. With the diode appropriately biased by a direct current source, microwave oscillations are excited in the resonator which are taken as the microwave output; in effect, the diode converts direct current energy to high frequency electromagnetic wave energy.

The oscillator output can conveniently be frequency modulated by modulating the diode bias current. The paper "IMPATT Oscillator Performance Improvement with Second-Harmonic Tuning," by C. B. Swan, Proceedings of the IEEE, Vol. 56, No. 9, Sept. 1968, pages 1616—1617, describes how frequency modulation sensitivity, using bias current modulation, can be improved by coupling to the diode two resonant circuits that respectively have resonant frequencies $f$ and $2f$, where output energy is taken at frequency $f$. Care must of course be taken to segregate the desired output frequency $f$ from the second harmonic frequency $2f$ without degrading operation efficiency. In practice, it is difficult to design circuits that can be conveniently tuned to the frequencies $f$ and $2f$ and from which energy at only frequency $f$ can be derived, without resort to filters or isolating devices that would tend to increase device expense and degrade efficiency.

Another goal in the IMPATT diode oscillator art is that of combining the outputs of a plurality of diodes in a single circuit. One solution is to mount two or more either series or parallel connected diodes in a single package; but the utility of this approach is limited because of the difficulty of adequately draining or sinking heat generated by the diodes. The copending application of Josenhans et al., Ser. No. 694,463, filed Dec. 29, 1967, describes how the power outputs of separately packaged diodes can be combined in a coaxial cable resonator while providing relatively efficient heat sinking of each diode package. Although it may be possible to combine the Josenhans et al. and Swan teachings to provide both high power output and frequency modulation sensitivity, the design of such a circuit would be difficult, and to the best of our knowledge, has not been accomplished.

SUMMARY OF THE INVENTION

It is an object of this invention to provide an oscillator circuit that combines the outputs of two or more avalanche diode packages.

It is another object of this invention to provide power combining in an avalanche diode oscillator circuit of the type using second harmonic tuning.

These and other objects of the invention are attained in an illustrative embodiment thereof comprising a cavity resonator, two avalanche diodes, with interconnected anode contacts, extending across the resonator, and a tuning plunger extending toward the diode interconnection. The tuning plunger provides a variable capacitance path to currents through the diode and is adjusted to give resonance at frequency $2f$. A second tuning plunger which constitutes one wall of the resonator is used to provide a fundamental resonant frequency $f$ in the oscillator circuit. With the diode packages being substantially identical and symmetrically mounted in the circuit, two separate oscillatory modes are established, one at frequency $f$ and the other at frequency $2f$. An output waveguide coupled to the resonator is designed to couple only to the mode oscillating at frequency $f$ and, for reasons that will be explained in more detail later, will not propagate generated energy at the frequency $2f$.

As mentioned before, second harmonic tuning is primarily useful for increasing FM sensitivity where the output energy is modulated by the diode bias current. It is also, however, useful in situations where one desires more efficient operation at an output frequency $f$ lower than $f_t$, where $f_t$ is the transit-time or "IMPATT" frequency of the diode. Another advantage of the circuit described thus far is that it permits massive heat sink elements to be mounted on opposite walls of the resonator and directly to the cathode contacts of the two diode packages.

In accordance with other embodiments to be described, energy at frequency $2f$ may be derived from the diode bias line, if so desired. Moreover, the structure described may be iterated along a waveguide to give power combining of a number of pairs of diodes.

These and other objects, features and advantages of the invention will be better understood from a consideration of the following detailed description taken in conjunction with the accompanying drawing.

DRAWING DESCRIPTION

DETAILED DESCRIPTION

Figure 1:
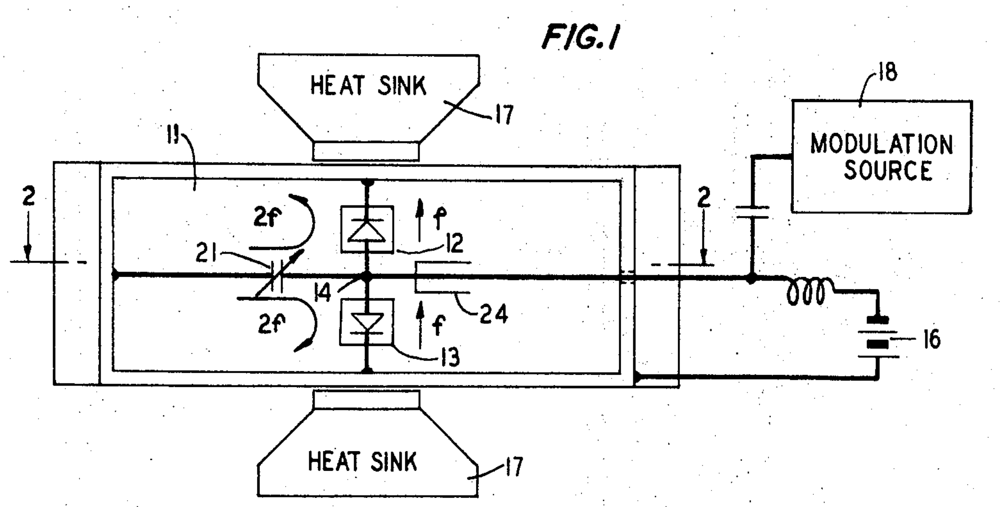
FIG. 1 is a schematic illustration of an avalanche diode oscillator circuit in accordance with an illustrative embodiment of the invention.

Referring now to FIG. 1, there is shown a negative resistance avalanche diode oscillator circuit comprising a waveguide cavity 11 and a pair of IMPATT diode packages 12 and 13 connected to opposite walls of the resonator and which have an anode contact interconnection 14. The diode packages are substantially identical, each having a transit-time frequency $f_t$, and are biased by a direct current source 16. Heat is drained from the two diode packages by heat sink members 17.

Figure 2:
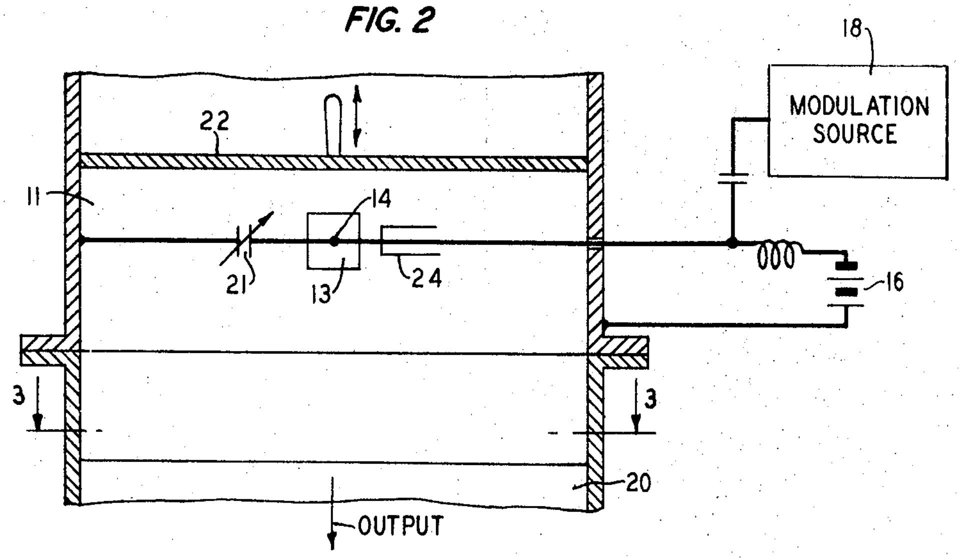
FIG. 2 is a view taken along lines 2–2 of FIG. 1.

Each IMPATT diode contained within diode packages 12 and 13 is constructed in a known manner; that is, each diode has a PN junction and a current transit region, the length of which is chosen to give current pulses at the diode terminals that are approximately 180° out-of-phase with respect to RF voltages applied to these same terminals. Oscillation generation requires an appropriate diode bias for giving periodic avalanche breakdowns, and an external resonator to produce a resonance at the desired operating frequency. As shown in FIG. 2, the generated microwave energy is removed by an output waveguide 20. A modulation source 18 frequency modulates the output by modulating the bias current directed to the diodes.

In accordance with one feature of the invention, a resonant circuit path is defined which extends through a variable capacitance 21, the cathode interconnection 14, and the two diodes in parallel, as is shown by the arrows $2f$ of FIG. 1. The frequency $2f$ is sufficiently close to the diode transit-time frequency $f_t$ to insure oscillation in accordance with the principles of IMPATT diode operation. The fundamental resonant frequency of resonator 11, however, is frequency $f$ which is one-half the frequency $2f$. The fundamental oscillation $f$ preferably takes place in an oscillatory mode in which current flows through the two diode packages in series as indicated by the two arrows $f$ of FIG. 1. When this mode of fundamental frequency oscillation and the mode of second harmonic oscillation described have been established, the fundamental frequency $f$ can be removed by the output waveguide 20 of FIG. 2 without removing energy at the second harmonic frequency $2f$. As described in the Swan publication, removing output energy at frequency $f$, where a resonance at $2f$ also exists, gives a higher frequency modulation sensitivity than would normally be the case. It also permits efficient oscillation generation at lower frequency than that of which the diodes used are normally capable.

In order to give independent output coupling at frequency $f$, it is important to design a resonator such that energy at frequencies $f$ and $2f$ oscillate in different oscillatory modes, and moreover, that output waveguide 20 be designed to propagate energy only in the oscillatory mode of frequency $f$.

With the diode packages 12 and 13 being substantially identical and symmetrically mounted, the oscillatory modes in which the second harmonic ($2f$) resonances occur are defined by field patterns that are symmetrical about a horizontal centerline through the resonator; these modes will collectively be referred to as the symmetric oscillatory mode. Because the fundamental resonance arises from current through both diodes in series, the oscillatory modes of the fundamental frequency are defined by electric field lines that are nonsymmetrical with respect to a horizontal centerline, which modes will be collectively referred to as the nonsymmetric oscillatory mode.

Figure 3:
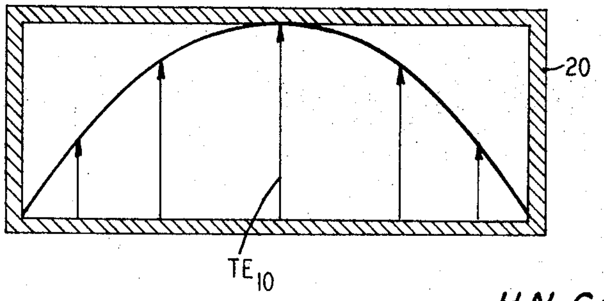
FIG. 3 is a view taken along lines 3–3 of FIG. 2.

It can intuitively be appreciated that the predominant component of the nonsymmetric mode is defined by electric field lines that extend vertically between opposite horizontal walls. This field pattern corresponds to the $TE_{10}$ waveguide mode, illustrated in FIG. 3, and accordingly, the waveguide is designed to transmit energy efficiently transmit energy efficiently at frequency $f$ in the $TE_{10}$ mode. The predominant oscillatory components at frequency $2f$ correspond respectively to the $TE_{01}$ waveguide mode, defined by horizontally extending electric field lines between opposite vertical walls, and the $TM_{11}$ waveguide mode, defined by electric field lines extending in opposite directions from a horizontal center line. By designing waveguide 20 and resonator 11 to be much longer in the horizontal dimension than in the vertical dimension, propagation only in the $TE_{10}$ mode, at the frequencies of interest, is easily assured.

For excitation of the desired oscillatory modes in resonator 11, the two diode packages 12 and 13 should be substantially identical and should be symmetrically mounted. The interconnection 14 should be midway between opposite horizontal walls, and moreover, the resonant frequency $f_r$ of each diode package should be close to, but less than, the frequency $2f$. $f_r$ is given by $$f_r = 1/2\pi\sqrt{LC} = k\,2f \qquad (1)$$

where L is the inductance of each diode package, C is the capacitance of each diode package and $k$ is a constant. For optimum stable operation, the suggested range for $k$ is 0.85 to 0.95.

In practice, the frequency $2f$ is tuned by varying the variable capacitance 21 and the frequency $f$ is tuned by moving a tuning plunger 22, which constitutes one wall of the resonator, as shown in FIG. 2. The fact that the second harmonic resonant circuit can be separately tuned makes optimum oscillator operation much more convenient than would be the case if $2f$ tuning could be changed only by tuning the fundamental circuit. A choke 24 is preferably included on the bias line for precluding transmission of the second harmonic along the bias line. The conductance $G_L$ of the load to which output energy is transmitted is of course preferably matched to the oscillator source for optimum stability and efficiency. It can be shown that the optimum load conductance is given by $$G_L = \frac{R}{2R^2 + 2\left(\omega L - \frac{1}{\omega C}\right)^2} \qquad (2)$$

where R is the negative resistance of each diode package and $\omega$ equals $2\pi f$. This load resistance is adjusted by tuning screws, or a properly dimensioned quarter-wave transformer, or other well-known means, in the output waveguide 20. The diode and bias voltage polarities shown in FIG. 1 may be reversed without changing the concept of the invention; that is, cathode contacts may be connected together at interconnection 14 and anode contacts are then connected to the heat sinks 17.

Figure 4:
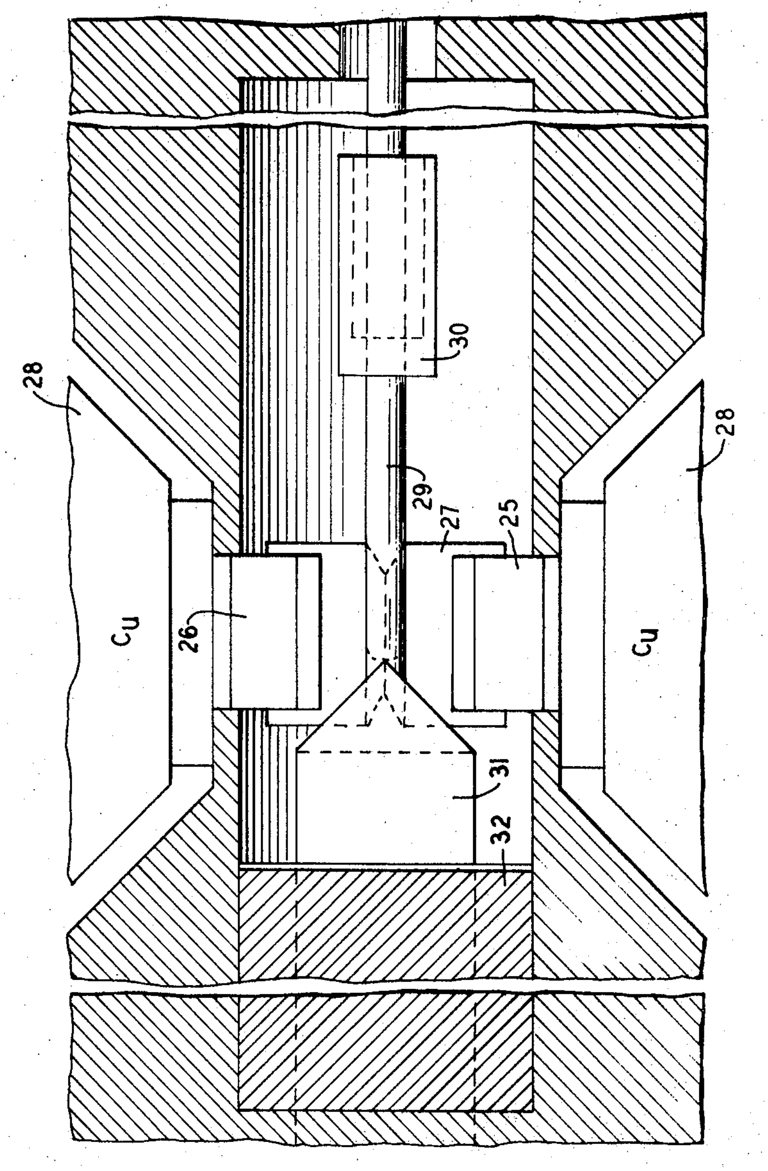
FIG. 4 is a sectional view of avalanche diode circuit apparatus which has been constructed in accordance with the FIG. 1 embodiment.

One circuit that has been tested is shown in FIG. 4. Two diode packages 25 and 26 each comprise a single germanium IMPATT diode having a frequency $f_r$ of 10 to 11 gigahertz. The diode packages are inserted through holes in the center of upper and lower walls of the resonator, and the smaller end of each package contacts an end of a center post 27. The post is long enough so that the large ends of the packages cannot simultaneously contact the outer waveguide surface. This permits a slight vertical movement of the diode stack by rotating both threaded heat sinks 28 for the purpose of balancing against escape of the second harmonic power to the $TE_{10}$ mode, or fundamental power to the TEM mode on the bias conductor. The fundamental, nonsymmetric, resonance is 6 gigahertz and the second harmonic, symmetric, resonance is 12 gigahertz.

The bias conductor 29 is a 0.02 inch wire which enters through a hole in the center of the narrow resonator wall. It is spring loaded against a groove in the center post 27 which permits the above-mentioned diode stack rotation. The movable twelve gigahertz choke 30 on the bias conductor is positioned so that a high impedance is presented to the center of the post at the second harmonic.

An adjustable probe 31 protrudes from a 0.2 inch thick iris 32. The iris and probe penetration are independently adjustable. The principal function of the iris is to keep the probe inductance small. The probe, of course, provides the required capacitance, corresponding to that of capacitor 21 of FIG. 2, for establishing the second harmonic resonance at 12 gigahertz. The resonator cross-sectional dimensions are 0.200 inch high and 1.590 inch wide. This provides a $TE_{01}$ mode cutoff frequency of 29.5 gigahertz, below which energy in the $TE_{01}$ mode was incapable of propagating. Impedance matching for the $TE_{10}$ mode to WR–159 waveguide is provided by a quarter-wave transformer section.

In summary, the circuit shown in FIG. 1 permits the outputs of two avalanche diode packages to be combined while both diode packages are efficiently drained of heat. External circuits at frequencies $f$ and $2f$ are provided which give high frequency modulation sensitivity when output energy is removed at frequency $f$. Energy at frequencies $f$ and $2f$ oscillate in appropriate modes to permit selective derivation of output energy only at frequency $f$.

Figure 5:
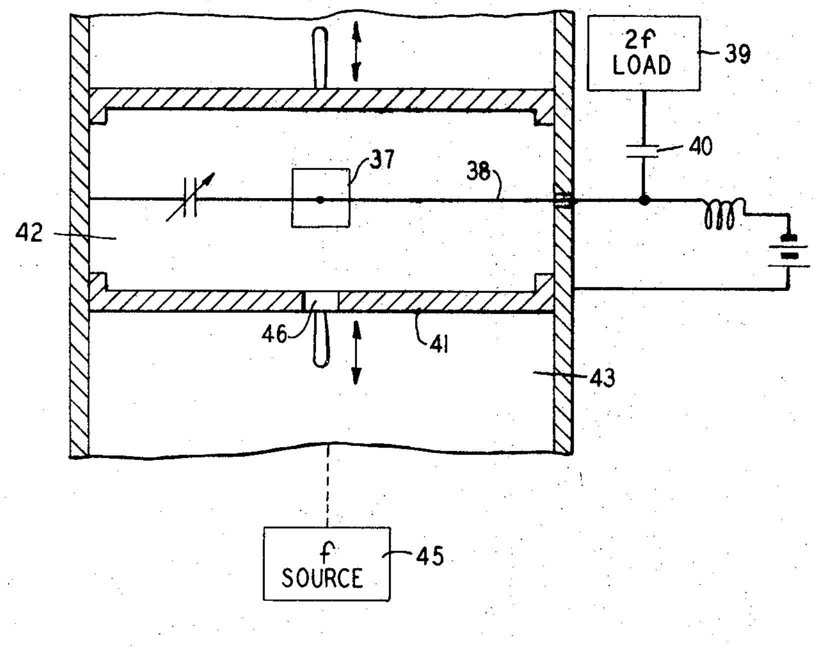
FIG. 5 is a sectional schematic illustration of another embodiment of the invention.
Figure 6:
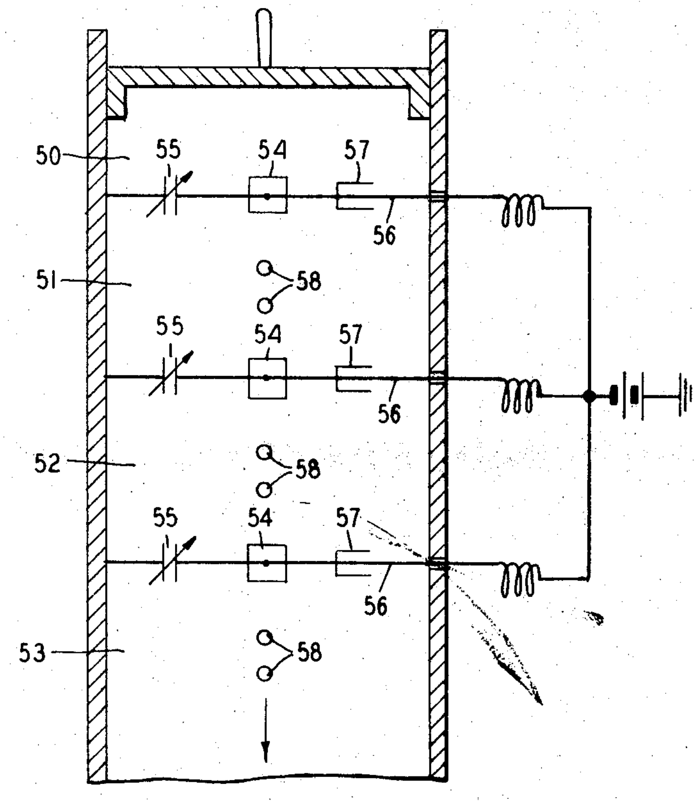
FIG. 6 is a sectional schematic illustration of yet another embodiment of the invention.

FIGS. 5 and 6 illustrate other embodiments of the invention. FIG. 5 corresponds to FIG. 2, and includes two diode packages, only one, diode package 37, being shown. The major differences are that no filter is included in the bias line 38, output energy is transferred from the bias line to a load 39 via a capacitive coupler 40, and the resonator includes a wall 41 that separates resonator 42 from waveguide 43. Resonances at frequencies $f$ and $2f$ are established in nonsymmetric and symmetric modes as in FIG. 2.

Energy at frequency $f$ from a source 45 is propagated by waveguide 43 and coupled to the nonsymmetric $f$ mode by an aperture 46. The resonance at the fundamental $f$ frequency in resonator 42 is thereby locked to the frequency of source 45, and the second harmonic frequency is fixed at $2f$. The second harmonic frequency of course propagates along bias line 38 and is removed by the capacitive coupler. The nonsymmetric mode at the fundamental frequency does not couple to the bias line.

The FIG. 6 embodiment comprises a plurality of closely coupled resonators 50, 51 and 52 located along a waveguide 53. Each resonator contains a pair of diode packages 54, only one being shown, a variable capacitance 55, and a bias line 56 having a choke 57, and each operates as does the resonator of FIG. 2. Tuning screws 58 located between adjacent resonators are used to tune the resonators to the same fundamental frequency, while the variable capacitances, as before, are used to tune the second harmonic frequencies. It can be shown that with the resonators closely coupled, the fundamental nonsymmetric mode energy propagates through output waveguide 53 in the $TE_{10}$ mode. If so desired, chokes 57 may be eliminated and second harmonic energy derived from the bias lines 56. The tuning screws 58 are merely one example of shunt susceptances used to establish the required resonances.

In any of the embodiments described, it appears that harmonic tuning, in accordance with the principles described in the Swan paper, may be made at even harmonics other than the second harmonic. In other words, tuned resonances may be formed at any frequency $2nf$, where $n$ is an integer, such as the fourth harmonic.

Various embodiments and modifications other than those shown and described may also be used. For example, a plurality of either series or parallel connected avalanche diodes may be used in each of the diode packages shown. The current paths shown in FIG. 1 may be established by a number of structures other than that explicitly shown in FIG. 4 and variable reactances other than the variable capacitances shown may be used to tune the second harmonic. While the invention gives particular advantages in a system using frequency modulation by modulation of the diode bias, a modulated bias current is not required for giving a useful output. Various other embodiments and modifications may be made by those skilled in the art without departing from the spirit and scope of the invention.

We claim:

1. An oscillator circuit comprising:
- a cavity resonator;
- first and second substantially identical negative resistance devices, each having corresponding first and second contacts and being capable of generating oscillations at at least one of two frequencies $f$ and $2f$;
- the first contacts of the negative resistance devices being interconnected, and the second contacts being respectively connected to opposite first and second walls of the resonator;
- means for tuning oscillations at frequency 2f comprising means for providing a path of variable reactance between a third wall of the resonator and the first contact interconnection of the negative resistance devices; and
- means for deriving output energy from the resonator at only one of said two frequencies.

2. The oscillator circuit of claim 1 wherein the negative resistance devices comprise avalanche diodes.

3. The oscillator circuit of claim 1 wherein the variable reactance is a capacitance.

4. The oscillator circuit of claim 1 wherein the resonator is resonant in a first oscillatory mode at frequency $f$ and is resonant in a second oscillatory mode at frequency $2f$, and the deriving means comprises a waveguide capable of efficiently coupling to, and propagating, electromagnetic wave energy in the first mode at frequency $f$, but being substantially incapable of coupling to electromagnetic wave energy in the second oscillatory mode at frequency $2f$.

5. The oscillator circuit of claim 1 further comprising:
- means for biasing the negative resistance devices comprising a conductor connected to the interconnected first contacts; and
- means for frequency modulating the output energy comprising means for modulating bias current transmitted by the conductor to the first contacts.

6. The oscillator circuit of claim 1 wherein: each negative resistance device has an inherent resonant frequency $f_r$ of approximately .85 to .95 times the frequency $2f$.

7. The oscillator circuit of claim 1 wherein the deriving means presents to the negative resistance devices a load conductance $G_L$ substantially given by $$G_L=\frac{R}{2R^2+2\left(\omega L-\frac{1}{\omega C}\right)^2}$$

where R is the magnitude of the negative resistance of each device, C is the capacitance of each device, L in the inductance of each device $\omega$ is $2\pi f$.

8. The oscillator circuit of claim 1 further comprising conductive heat sink members connected to the first and second resonator walls for transmitting heat from the first and second devices.

9. The oscillator circuit of claim 2 wherein the variable reactance is a variable capacitance.

10. The oscillator circuit of claim 9 wherein the resonator is resonant in a first oscillatory mode at a frequency $f$ and is resonant in a second oscillatory mode at a frequency $2f$, and the driving means comprises a waveguide capable of efficiently coupling to, and propagating, electromagnetic wave energy in the first mode at frequency f, but being substantially incapable of coupling to and propagating electromagnetic wave energy in the second oscillatory mode at frequency $2f$.

11. The oscillator of claim 10 wherein:
- the interconnection of the first contacts is midway between the first and second walls; and
- the first oscillatory mode has a predominant component corresponding to the $TE_{10}$ waveguide mode and the second oscillatory mode has a predominant component corresponding to the $TE_{01}$ waveguide mode.

12. The oscillator circuit of claim 11 further comprising means for biasing the devices comprising a conductor connected to the interconnected first contacts, and means for frequency modulating the output energy comprising means for modulating bias current transmitted by the conductor to the first contacts.

13. The oscillator circuit of claim 12 wherein each device has a resonant frequency $f_r$ of approximately .85 to .95 times the frequency $2f$.

14. The oscillator circuit of claim 13 wherein the deriving means presents a load conductance to the devices substantially given by $$G_L=\frac{R}{2R^2+2\left(\omega L-\frac{1}{\omega C}\right)^2}$$

where R is the negative resistance of each device, C is the capacitance of each device, L is the inductance of each device, and $\omega$ is $2\pi f$.

15. The oscillator circuit of claim 14 further comprising conductive heat sink members connected to the first and second resonator walls for transmitting heat from the first and second negative resistance devices.

16. The oscillator circuit of claim 15 wherein:
- the interconnection of the first contacts is midway between the first and second walls; and
- the first mode is capable of coupling to the $TE_{10}$ waveguide mode and the second mode is incapable of coupling to the $TE_{10}$ waveguide mode.

17. An oscillator circuit comprising:
- a cavity resonator;
- first and second substantially identical negative resistance devices, each having corresponding first and second contacts and being capable of generating oscillations at at least one of a plurality of frequencies $f$ and $2nf$, where $n$ is an integer;
- the first contacts of the negative resistance devices being interconnected, and the second contacts being respectively connected to opposite first and second walls of the resonator;
- means for tuning oscillations at frequency $2nf$, comprising means for providing a path of variable reactance between a third wall of the resonator and the first contact interconnection of the negative resistance devices; and
- means for deriving output energy at frequency $f$ from the resonator.

18. The oscillator circuit of claim 17 wherein means are provided for deriving output electromagnetic energy at frequency $2nf$ from the resonator.

19. The oscillator circuit of claim 18 wherein the output electromagnetic energy at frequency $2nf$ is removed by means of a bias conductor connected to the first contact interconnection.

20. The oscillator circuit of claim 19 wherein electromagnetic energy at frequency $f$ is prevented from escaping from the resonator.

21. The oscillator circuit of claim 17 wherein said cavity resonator is one of a plurality of coupled cavity resonators each having substantially identical resonant characteristics and each including substantially identical negative resistance devices, device interconnections, and variable reactance tuning means.

22. The oscillator circuit of claim 17 wherein said cavity resonator is one of a plurality of coupled cavity resonators each having substantially identical resonant characteristics and each including substantially identical negative resistance devices, device interconnections, and variable reactance tuning means.